United States Patent
Shin et al.

(10) Patent No.: US 10,050,235 B2
(45) Date of Patent: Aug. 14, 2018

(54) OPTICAL FILM FOR REDUCING COLOR SHIFT AND ORGANIC LIGHT-EMITTING DISPLAY DEVICE EMPLOYING THE SAME

(71) Applicants: Samsung Electronics Co., Ltd., Suwon-si, Gyeonggi-do (KR); Samsung Corning Precision Materials Co., Ltd., Gumi-si, Gyeongsangbuk-do (KR); CHEIL INDUSTRIES INC., Gumi-si, Gyeongsangbuk-do (KR)

(72) Inventors: Youmin Shin, Gyeongsangbuk-do (KR); Hyunmin Kim, Uiwang-si (KR); Hongshik Shim, Seoul (KR); Young Oh, Uiwang-si (KR); Chulho Jeong, Hwaseong-si (KR); Eunyoung Cho, Gyeongsangbuk-do (KR)

(73) Assignees: SAMSUNG ELECTRONICS CO., LTD, Gyeonggi-Do (KR); CORNING PRECISION MATERIALS CO., LTD., Chungcheongnam-Do (KR); CHEIL INDUSTRIES INC., Gyeongsangbuk-Do (KR)

(*) Notice: Subject to any disclaimer, the term of this patent is extended or adjusted under 35 U.S.C. 154(b) by 173 days.

(21) Appl. No.: 14/510,513

(22) Filed: Oct. 9, 2014

(65) Prior Publication Data

US 2015/0102328 A1    Apr. 16, 2015

(30) Foreign Application Priority Data

Oct. 15, 2013    (KR) .................. 10-2013-0122816

(51) Int. Cl.
*H01L 51/52*    (2006.01)
*G02B 5/02*    (2006.01)
(Continued)

(52) U.S. Cl.
CPC ........ *H01L 51/5275* (2013.01); *G02B 5/0215* (2013.01); *G02B 5/0257* (2013.01);
(Continued)

(58) Field of Classification Search
CPC ............. H01L 27/3232; H01L 51/5275; H01L 51/5281; H01L 51/5284; G02B 5/0215; G02B 5/0257; G02B 5/0278
See application file for complete search history.

(56) References Cited

U.S. PATENT DOCUMENTS 6,337,160 B1    1/2002    Hilarius et al.
6,585,881 B2    7/2003    Davis et al.
(Continued)

FOREIGN PATENT DOCUMENTS

JP    2010096916 A    4/2010
JP    2012247559 A    12/2012
(Continued)

OTHER PUBLICATIONS

English machine translation of WO2010/113737A1 of record.*

*Primary Examiner* — Marcos D Pizarro
*Assistant Examiner* — Christopher M Roland
(74) *Attorney, Agent, or Firm* — Cantor Colburn LLP

(57) ABSTRACT

An optical film includes: a high refractive index pattern layer including a material having a refractive index greater than about 1, where a plurality of grooves, each having a curved groove surface and a depth greater than a width thereof, is defined on a first surface of the high refractive index pattern layer, the plurality of grooves defines a pattern, the plurality of grooves are two-dimensionally arranged in a first direction and a second direction, and a first distance between adjacent grooves in the first direction and a second distance between adjacent grooves in the second direction are different from each other; and a low refractive index
(Continued)

pattern layer including a material having a refractive index less than the refractive index of the high refractive index pattern layer and further including a plurality of fillers which fills the plurality of grooves, respectively.

16 Claims, 11 Drawing Sheets

(51) Int. Cl.
    *G02B 1/11*     (2015.01)
    *G02B 5/30*     (2006.01)
    *H01L 27/32*     (2006.01)

(52) U.S. Cl.
    CPC ........ G02B 5/0278 (2013.01); H01L 51/5281 (2013.01); H01L 51/5284 (2013.01); *G02B 1/11* (2013.01); *G02B 5/3033* (2013.01); *H01L 27/3232* (2013.01); *H01L 51/5265* (2013.01)

(56) References Cited

U.S. PATENT DOCUMENTS

| | | | | |
|---|---|---|---|---|
| 2002/0167725 A1* | 11/2002 | Goto | ............... | G03B 21/625 359/456 |
| 2007/0046161 A1* | 3/2007 | Haenichen | ......... | H01L 51/5275 313/112 |
| 2007/0069635 A1* | 3/2007 | Cok | ............... | H01L 27/322 313/504 |
| 2007/0153377 A1* | 7/2007 | Goto | ............... | G02B 5/045 359/460 |
| 2007/0159093 A1* | 7/2007 | Yuki | ............... | H01L 51/524 313/512 |
| 2008/0036945 A1* | 2/2008 | Chen | ............... | G02B 5/3083 349/95 |
| 2008/0137222 A1* | 6/2008 | Park | ............... | B29D 11/00634 359/885 |
| 2009/0267492 A1* | 10/2009 | Kwon | ............... | H01L 51/524 313/504 |
| 2011/0198654 A1* | 8/2011 | Naya | ............... | H01L 51/5268 257/98 |
| 2012/0286258 A1* | 11/2012 | Naraoka | ............... | C09K 11/06 257/40 |
| 2014/0252330 A1* | 9/2014 | Oh | ............... | H01L 51/5275 257/40 |
| 2014/0252331 A1* | 9/2014 | Oh | ............... | G02B 5/0242 257/40 |
| 2015/0076468 A1* | 3/2015 | Yamaguchi | ............... | G02B 1/118 257/40 |

FOREIGN PATENT DOCUMENTS

| | | |
|---|---|---|
| KR | 1020130002757 A | 1/2013 |
| WO | 2010113737 A1 | 10/2010 |

* cited by examiner

OPTICAL FILM FOR REDUCING COLOR SHIFT AND ORGANIC LIGHT-EMITTING DISPLAY DEVICE EMPLOYING THE SAME

CROSS-REFERENCE TO RELATED APPLICATIONS

This application claims priority to Korean Patent Application No. 10-2013-0122816, filed on Oct. 15, 2013, and all the benefits accruing therefrom under 35 U.S.C. § 119, the content of which in its entirety is herein incorporated by reference.

BACKGROUND

1. Field

The disclosure relates to an optical film for reducing a color shift, and an organic light-emitting display device including the optical film.

2. Description of the Related Art

An organic light-emitting device ("OLED") typically includes an anode, an organic light-emitting layer and a cathode. In such an OLED, when a voltage is applied between the anode and the cathode, holes are injected from the anode into the organic light-emitting layer and electrons are injected from the cathode into the organic light-emitting layer. When the holes and the electrons that are injected into the organic light-emitting layer recombine in the organic light-emitting layer, excitons are generated in the organic light-emitting layer, and light is thereby emitted when the states of the excitons change from an excited state to a ground state.

The OLED, where a light-emitting material is an organic material, may degrade and thus has a short lifespan. Accordingly, various technologies have been developed to improve the lifespan of the OLED.

One of the technologies is a technology using a microcavity structure which involves resonating light of a specific wavelength to increase intensity and emitting the light with the increased intensity. The microcavity structure typically includes a structure in which distances between an anode and a cathode are designed to match representative wavelengths of red (R), green (G) and blue (B) light, and thus only a corresponding light is resonated and emitted to the outside and the intensity of lights of other wavelengths is relatively weakened. As a result, the intensity of the light beam emitted to the outside is increased and sharpened, thereby increasing luminance and color purity. The increase in the luminance leads to low current consumption and a long lifespan.

SUMMARY

In an organic light-emitting diode ("OLED") having a micro cavity structure that resonates light of a specific wavelength to increase intensity, wavelengths to be amplified are determined based on the thickness of an organic deposition material layer. Here, length of a light path changes at a lateral side, thereby causing an effect similar to change of thickness of an organic deposition material layer. Therefore, wavelengths to be amplified are changed.

Accordingly, in such an OLED, as the viewing angle is tilted from a front to a side, the maximum resolution wavelength becomes shorter, and thus color shift occurs as the maximum resolution wavelength decreases. For example, even if white color is embodied at the front, the white color may become bluish at a lateral side due to blue shift phenomenon.

Provided are embodiments of an optical film for reducing a color shift and an organic light-emitting display device including the optical film.

According to an embodiment of the invention, an optical film includes: a high refractive index pattern layer including a material having a refractive index greater than about 1, where a plurality of grooves, each having a curved surface and a depth greater than a width thereof, is defined on a first surface of the high refractive index pattern layer, the plurality of grooves defines a pattern of the high refractive index pattern layer, the plurality of grooves are two-dimensionally arranged in a first direction and a second direction, and a first distance between adjacent grooves in the first direction and a second distance between adjacent grooves in the second direction are different from each other; and a low refractive index pattern layer including a material having a refractive index less than the refractive index of the high refractive index pattern layer and further including a plurality of fillers which fills the plurality of grooves, respectively.

In an embodiment, a cross-sectional shape of each of the plurality of grooves in the first surface may be an isotropic shape.

In an embodiment, the plurality of grooves may be arranged in a quadrangular form.

In an embodiment, the plurality of grooves may be arranged in a rectangular form.

In an embodiment, the plurality of grooves may be arranged along a plurality of straight lines, which extends in the first direction and may be spaced apart from one another in the second direction, and the grooves on adjacent straight lines of the plurality of straight lines are alternately disposed.

In an embodiment, the plurality of grooves may be irregularly arranged, where an average of first distances between adjacent grooves in the first direction and an average of second distances between adjacent grooves in the second direction are different from each other.

In an embodiment, an area ratio of an area of the pattern to an area of a boundary surface between the high refractive index pattern layer and the low refractive index pattern layer may be equal to or greater than about 25% and equal to or less than about 50%.

In an embodiment, a ratio of the depth to the width of each of the plurality of grooves may be in a range from about 2 to about 2.8.

In an embodiment, the low refractive index pattern layer may further include a flat portion which connects the plurality of fillers.

In an embodiment, the optical film may further include: an anti-reflection film disposed on a second surface of the high refractive index pattern layer, which is opposite to the first surface; and an adhesive layer disposed on the low refractive index pattern layer.

In an embodiment, the optical film may further include a circular polarization film disposed between the high refractive index pattern layer and the anti-reflection film, and including a phase shift layer and a linear polarization layer.

In an embodiment, the optical film may further include a transmittance-adjusting layer disposed between the high refractive index pattern layer and the anti-reflection film.

According to another embodiment of the invention, an organic light-emitting display device includes: an organic light-emitting panel including a plurality of pixels including organic light-emitting layers, where the organic light-emitting layers emit light of different wavelengths from each other and each of the plurality of pixels has a microcavity structure which resonates light corresponding to one of the different wavelengths; and an embodiment of the optical film described above, which is disposed on the organic light-emitting panel.

In an embodiment, the first direction and the second direction, in which the plurality of grooves are two-dimensionally arranged, may respectively correspond to a horizontal direction and a vertical direction of the organic light-emitting panel.

In an embodiment, the second distance may be less than the first distance.

In an embodiment, the plurality of grooves may be irregularly arranged in the optical film, and an average of second distances between adjacent grooves in the second direction may be less than an average of first distances between adjacent grooves in the first direction.

BRIEF DESCRIPTION OF THE DRAWINGS

These and/or other features of the invention will become apparent and more readily appreciated from the following description of embodiments of the invention, taken in conjunction with the accompanying drawings, in which.

DETAILED DESCRIPTION

Figure 1:
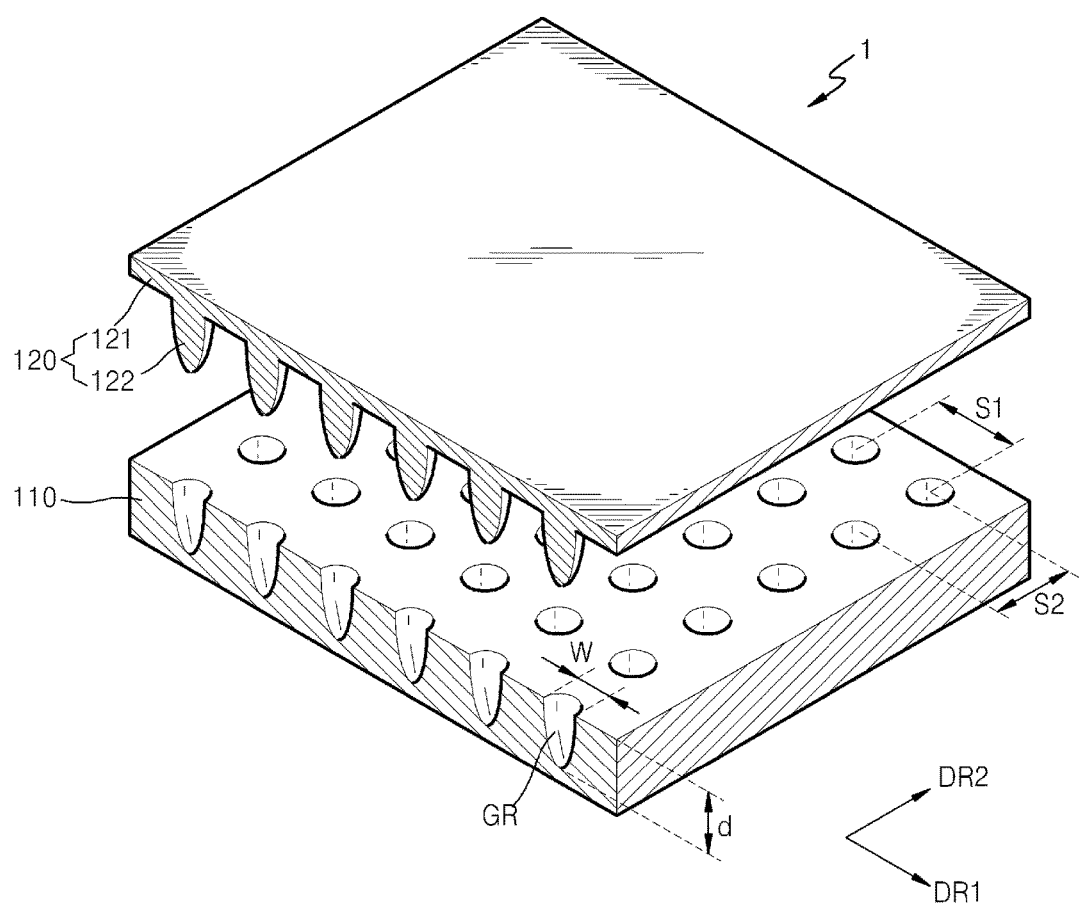
FIG. 1 is an exploded perspective view illustrating an embodiment of an optical film according to the invention.

The invention will now be described more fully hereinafter with reference to the accompanying drawings, in which various embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in further detail with reference to the accompanying drawings.

FIG. 1 is an exploded perspective view illustrating an embodiment of an optical film 1 according to the invention.

In an embodiment, the optical film 1 includes a high refractive index pattern layer 110 including a pattern defined by a plurality of grooves GR, each having a curved groove surface and a depth greater than a width thereof, and a low refractive index pattern layer 120 disposed on the high refractive index pattern layer 110. In such an embodiment, the low refractive index pattern layer 120 includes a plurality of fillers 122 corresponding to the plurality of grooves GR. In one embodiment, for example, the grooves GR of the high refractive index pattern layer 110 may be engraved on a surface thereof, and the fillers 122 of the low refractive index pattern layer 120 may fill the grooves GR.

The plurality of grooves GR are two-dimensionally arranged in a first direction DR1 and a second direction DR2. In one embodiment, for example, the first and second directions may be perpendicular to each other. A first distance S1 between adjacent grooves GR in the first direction and a second distance S2 between adjacent grooves GR in the second direction DR2 may be set to be different from each other. A cross-sectional shape of each of the grooves GR may be, but is not limited to, an isotropic shape. The plurality of grooves GR may be arranged in a quadrangular form, and may be arranged in a rectangular shape in the first direction DR1 and the second direction DR2, as shown in FIG. 1. However, embodiments of the invention are not limited thereto. In an alternative embodiment, the plurality of grooves GR may be arranged in predetermined pattern in the first direction DR1 and the second direction DR2.

The first distance S1 between adjacent grooves GR in the first direction DR1 and the second distance S2 between adjacent grooves GR in the second direction DR2 may determine the amount of improvement in a color shift in the first direction DR1 and the second direction DR2, which will be described later in detail with computer simulation results.

In an embodiment, an aspect ratio of each of the grooves GR, which is a ratio of a depth d to a width W of each of the grooves GR, may be in a range from about 2 to about 2.8.

An area ratio of the area occupied by the groove patterns to an area of a boundary surface between the high refractive index pattern layer 110 and the low refractive index pattern layer 120 may be equal to or greater than about 25% and equal to or less than about 45%. Hereinafter, the area ratio will be referred to as a 'pattern occupying ratio'. The pattern occupying ratio is a design factor that is considered to obtain a predetermined front transmittance or more when a shape or an arrangement type of the pattern is determined in consideration of the amount of improvement in a color shift, which will be described later in detail with computer simulation results.

The high refractive index pattern layer 110 may include be formed of a material having a refractive index that is equal to or greater than about 1, for example, a transparent plastic material. The high refractive index pattern layer 110 may include or be formed of a transparent plastic material and a light diffuser or a light absorber. In an embodiment, the light diffuser may include diffusing beads, and the light absorber may include a black dye such as carbon black, for example. In such an embodiment, the light diffuser functions to planarize a peak that may occur in a color shift ($\Delta u'v'$) and luminance profile with respect to viewing angle and thus to improve visual characteristics. In such an embodiment, the light absorber may include a dye that selectively absorbs a specific wavelength or carbon black that may absorb nearly all wavelengths of visible light to increase a contrast ratio or a color purity.

A surface of each of the grooves GR is a curved surface, for example, the groove GR may have any of various aspheric surfaces such as an elliptical surface, a parabolic surface, or a hyperbolic surface, for example.

The low refractive index pattern layer 120 may include or be formed of a resin material having a refractive index that is less than a refractive index of the high refractive index pattern layer 110. In an embodiment, the low refractive index pattern layer 120 may include or be formed of a transparent plastic material and a light diffuser or a light absorber. In such an embodiment, the light diffuser may include diffusing beads, and the light absorber may be a black dye such as carbon black, for example.

The low refractive index pattern layer 120 may include the fillers 122 having shapes corresponding to the grooves GR defined in the high refractive index pattern layer 110, and may further include a flat portion 121 that connects the plurality of fillers 122. In an embodiment, shapes of the fillers 122 are the same as those of the grooves GR, and shapes of the fillers 122 and the grooves GR may have the same meaning herein when used to describe a shape of the pattern.

The optical film 1 that refracts and emits light, which is incident in one direction, in various directions according to incident positions functions to mix light, which will be described hereinafter with reference to FIGS. 2 and 3.

Figure 2:
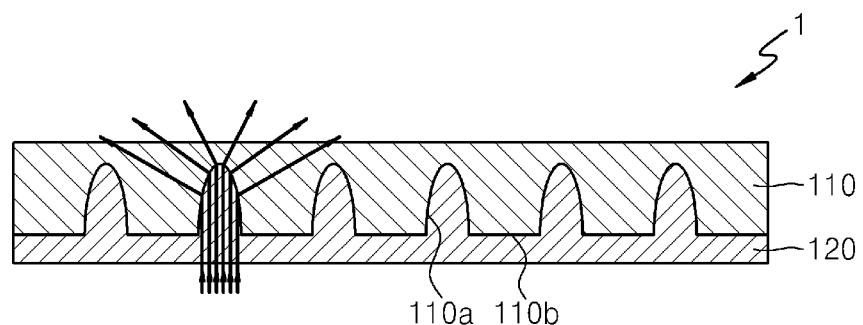
FIG. 2 is a cross-sectional view illustrating an optical path through which light vertically incident on the optical film of FIG. 1 is emitted.

FIG. 2 is a cross-sectional view illustrating an optical path through which light vertically incident on the optical film 1 of FIG. 1 is emitted. FIG. 3 is a cross-sectional view illustrating an optical path through which light obliquely incident on the optical film 1 of FIG. 1 is emitted.

Figure 3:
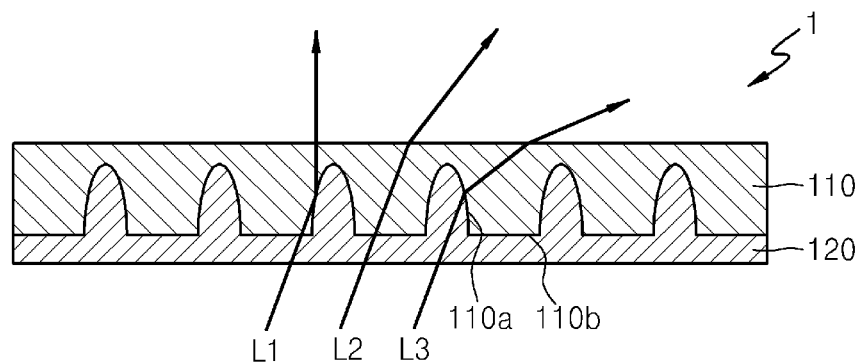
FIG. 3 is a cross-sectional view illustrating an optical path through which light obliquely incident on the optical film of FIG. 1 is emitted.

Referring to FIGS. 2 and 3, in an embodiment, a boundary surface between the high refractive index pattern layer 110 and the low refractive index pattern layer 120 includes a curved surface 110a that defines a groove GR and a flat surface 110b, and the curved surface 110a functions as a lens surface.

Referring to FIG. 2, light vertically incident on the optical film 1 is refracted and emitted from the optical film 1 in directions according to positions at which the light meets the curved surface 110a. That is, light beams incident to the optical film 1 (e.g., toward curved surface 110a thereof) with the same incident angle are refracted in various directions according to positions at which the light meets the curved surface 110a, thereby the optical film 1 diffuses light.

Referring to FIG. 3, light obliquely incident on the optical film 1 is refracted in various directions according to positions at which the light is incident. In such an embodiment, as shown in FIG. 3, light L1 that passes through the flat surface 110b and meets the curved surface 110a in the high refractive index pattern layer 110 is totally reflected by the curved surface 110a and emitted from the optical film 1. In such a path, an angle at which the light L1 is emitted from a top surface of the high refractive index pattern layer 110 is less than an angle at which the light L1 is incident on the optical film 1. In such an embodiment, light L2 that passes through the flat surface 110b without passing through the curved surface 110a is refracted at a boundary between the high refractive index pattern layer 110 and the outside, with a refraction angle that is greater than an incident angle. That is, the light L2 is emitted from the optical film 1 at an angle that is greater than the incident angle at which the light L2 is incident on the optical film 1. In such an embodiment, light L3 that meets the curved surface 110a in the low refractive index pattern layer 120 is refracted by the curved surface 110a and then is refracted again by the top surface of the high refractive index pattern layer 110, such that the light L3 is emitted from the optical film 1 at a refraction angle that is greater than that of the light L2 that is emitted after passing through the flat surface 110b without meeting the curved surface 110a. As such, the lights L1, L2, and L3 that are obliquely incident on the optical film 1 at the same angle are emitted from the optical film 1 at different refraction angles according to positions on the optical film 1 at which the lights L1, L2 and L3 are incident.

In an embodiment, as described above, during light beams are passing through the optical film 1, light beams incident on the optical film 1 at various angles are mixed together.

In FIGS. 2 and 3, a specific optical path through which incident light is diffused is exemplary, and is also exaggerated for convenience of illustration. For example, refraction of light that may occur at a flat surface 110b is not shown. Also, an optical path may be slightly changed based on a refractive index difference between the high refractive index pattern layer 110 and the low refractive index pattern layer 120, an aspect ratio of each of the grooves GR in the high refractive index pattern layer 110, cycles in which the grooves GR are repeatedly arranged, the width W of each of the grooves GR, and a shape of a curved surface of the groove GR, and thus an extent to which light is mixed and a luminance of emitted light are also changed based on the changes in the optical path.

In an embodiment, when light beams incident on the optical film 1 have different optical characteristics according to their incident angles, the light beams are emitted after the optical characteristics are uniformly combined by the light mixing effect describe above. In one embodiment, for example, when light is emitted from an organic light-emitting device ("OLED"), a color shift that is a phenomenon where color characteristics slightly vary according to an angle at which the light is emitted occurs. However, since light of different color shift are mixed after the light passes through the optical film 1 having the above-described structure, the degree of color shift according to viewing angles is reduced.

In the description above, the cross-sectional views of FIGS. 2 and 3 may correspond to any cross-sectional view perpendicular to a surface defined by the first direction DR1 and the second direction DR2 in FIG. 1. In an embodiment, the optical film 1 may mix light beams, which are incident at various angles on the optical film 1, at any azimuth angle.

Figure 4:
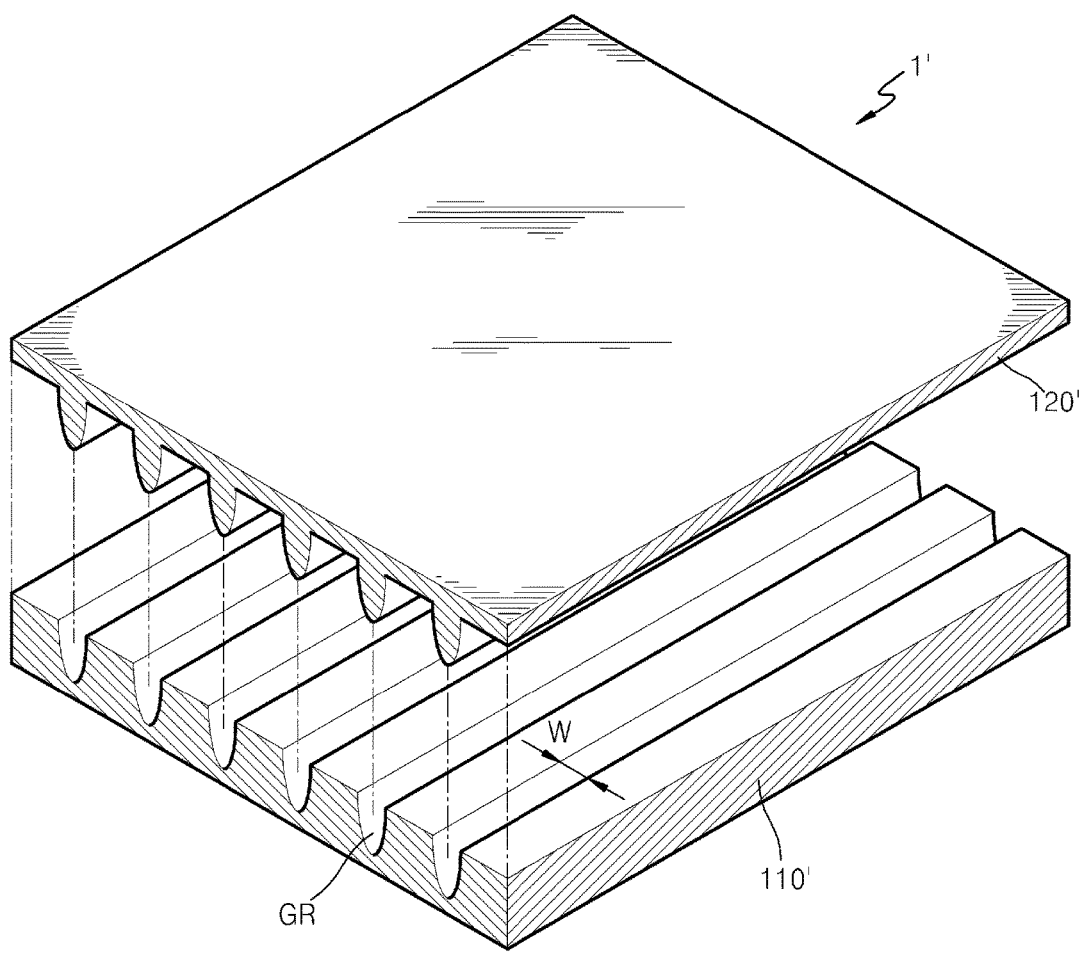
FIG. 4 is an exploded perspective view illustrating a structure of a comparative embodiment of an optical film.

FIG. 4 is an exploded perspective view illustrating a structure of a comparative embodiment of an optical film 1'.

The comparative embodiment of the optical film 1' shown in FIG. 4 includes a high refractive index pattern layer 110' and a low refractive index pattern layer 120', and each of the grooves GR is defined or formed in a stripe shape that extends in one direction. Hereinafter, a display device including such a comparative embodiment of the optical film will be referred to as a "comparative example".

Figure 5:
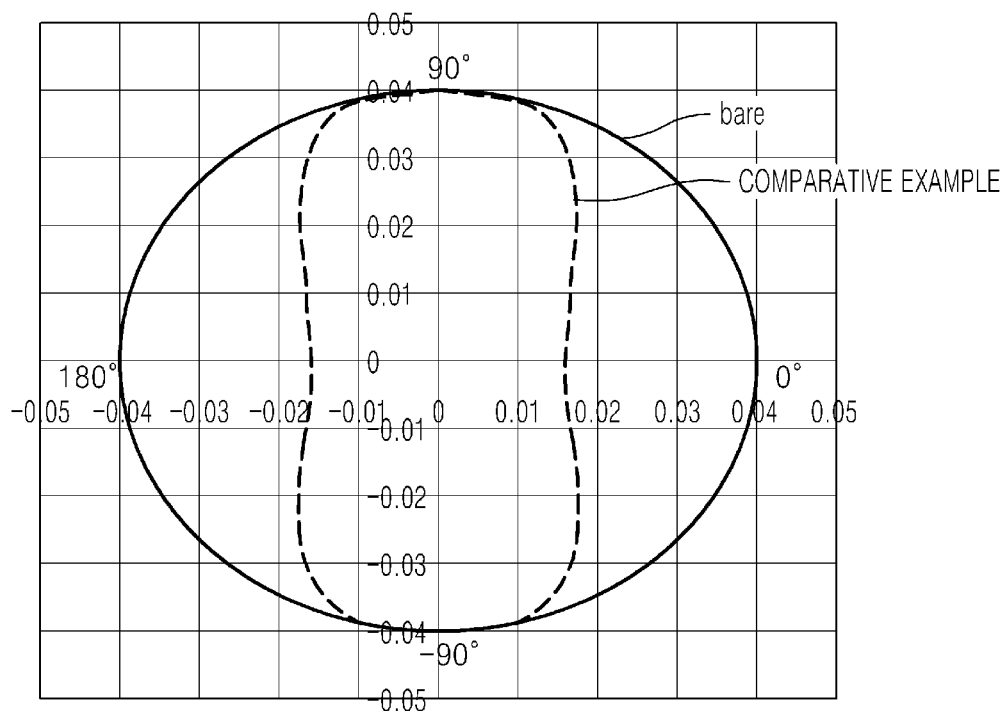
FIG. 5 is a graph illustrating a color shift distribution of light passing through a display panel including a comparative embodiment of an optical film and a display panel including no optical film.

FIG. 5 is a graph illustrating a color shift distribution of light passing through a display panel including a comparative embodiment of an optical film and a display panel including no optical film (also referred to as, a "bare case").

The graphs show computer simulation results obtained after measuring an organic light-emitting display panel including an OLED having a microcavity structure. A color shift seen at each azimuth angle was calculated under conditions where a viewing angle is about 60° and front white (x, y)=(0.28, 0.29).

Referring to the graph of FIG. 5, a color shift in the comparative example including the optical film is less than a color shift in the bare case including no optical film. In the comparative example, a color shift in a horizontal direction is reduced, but a reduction in a color shift in a vertical direction is reduced, thereby resulting in little improvement in a color shift in the vertical direction. In the comparative example, where a stripe-shaped pattern is used, a color shift in a direction perpendicular to the stripe-shaped pattern is mainly reduced.

In an embodiment of the invention, the optical film 1 is configured to include patterns that are two-dimensionally arranged to reduce a color shift in an overall azimuth angle range. As described above with reference to FIGS. 2 and 3, since color mixing occurs at various azimuth angles, a color shift in an overall azimuth angle range may be substantially improved. Also, a viewing angle at a specific azimuth angle may be increased by appropriately setting an arrangement type.

Figure 6:
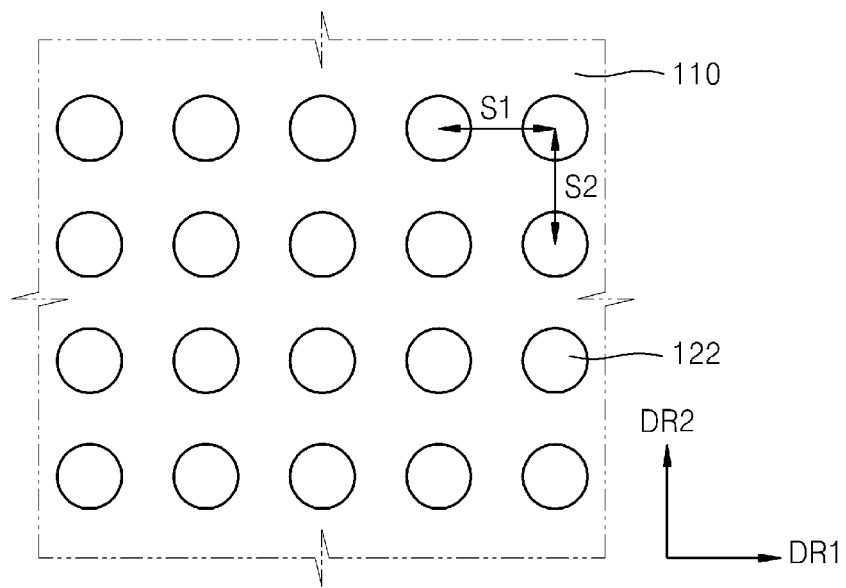
FIGS. 6 and 7 are plan views illustrating arrangements of filler in embodiments of the optical film according to the invention.
Figure 7:
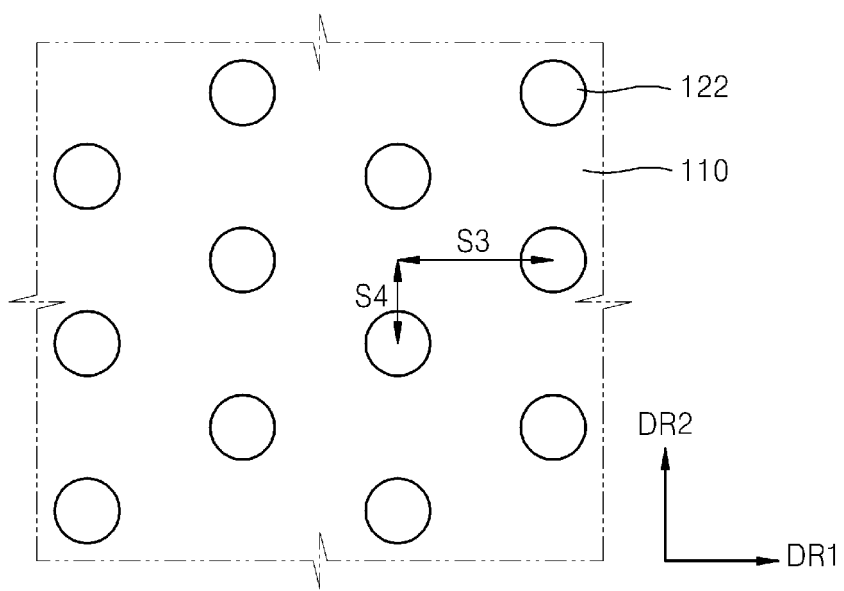

FIGS. 6 and 7 are plan views illustrating arrangements of fillers in embodiments of the optical film 1, according to the invention.

Referring to FIG. 6, in an embodiment, the plurality of fillers 122 are arranged in a rectangular form in the first direction DR1 and the second direction DR2. In FIG. 6, a distance between adjacent fillers 122 in the first direction DR1 is denoted by S1 and a distance between adjacent fillers 122 in the second direction DR2 is denoted by S2. A color shift may be reduced in an overall azimuth angle range by allowing the distances S1 and S2 between the adjacent fillers 122 in the first and second directions DR1 and DR 2 to be substantially equal to each other, or a color shift in a corresponding direction may be further reduced by allowing any one of the distances S1 and S2 to be greater than the other.

Referring to FIG. 7, in an alternative embodiment, the plurality of fillers 122 are arranged on a plurality of straight lines that are parallel to one another in the first direction DR1 and are spaced apart from one another in the second direction DR2, and the fillers 122 on adjacent straight lines alternate with each other, e.g., alternately disposed in a staggered shape or a zigzag manner. In FIG. 7, a distance between adjacent fillers 122 in the first direction DR1 is denoted by S3, and a distance between adjacent fillers 122 in the second direction DR2 is denoted by S4. In such an embodiment, a reduction in a color shift at a specific azimuth angle may be further enhanced by appropriately determining a ratio of the distance S3 to the distance S4 in the arrangement.

In an embodiment, as shown in FIGS. 6 and 7, the plurality of fillers 122 may be regularly arranged, but the embodiments of the invention are not limited thereto. In an alternative embodiment, the plurality of fillers 122 may be irregularly arranged. In such an embodiment, an average of first distances S1 between adjacent fillers 122 in the first direction DR1 and an average of second distances S2 between adjacent grooves GR in the second direction DR2 may be set as design factors that determines the color shift. In such an embodiment, the average of the first distances S1 and the average of the second distances S2 may be equal to each other to reduce the color shift by substantially the same amount in an overall azimuth angle range. Alternatively, to increase the amount of improvement in a color shift at a specific azimuth angle, a ratio of the average of the first distances S1 to the average of the second distances S2 may be appropriately set.

Figure 8:
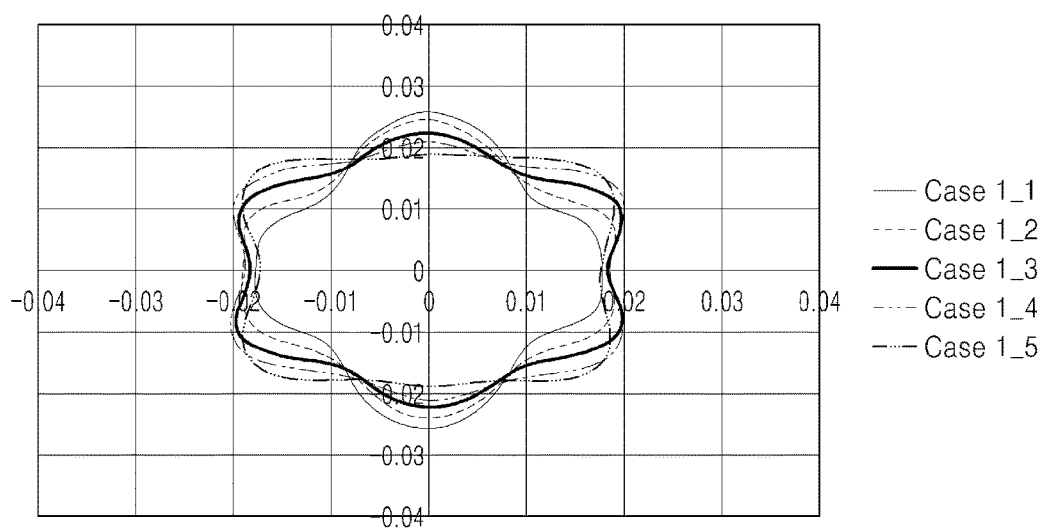
FIG. 8 is a graph illustrating a color shift when a ratio S2/S1 is changed in the arrangement of the fillers of FIG. 6.

FIG. 8 is a graph illustrating a color shift when a ratio S2/S1 is changed in the arrangement of fillers in FIG. 6.

In cases 1_1, 1_2, 1_3, 1_4 and 1_5 shown in FIG. 8, where a pattern occupying ratio is about 45% and the ratio S2/S1 is 0.69, 0.83, 1, 1.21 and 1.45, respectively, as the ratio S2/S1 increases, a color shift in a horizontal direction increases and a color shift in a vertical direction decreases. Also, a color shift in a diagonal direction in a rectangular arrangement is the smallest in an overall azimuth angle range in any of the cases 1_1, 1_2, 1_3, 1_4 and 1_5.

Figure 9:
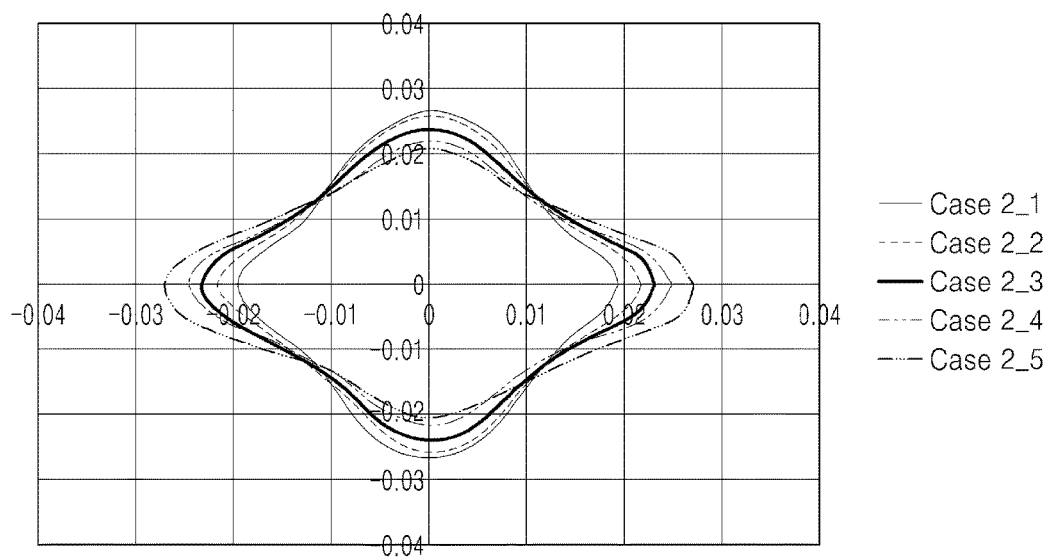
FIG. 9 is a graph illustrating a color shift when a ratio S4/S3 is changed in the arrangement of the fillers of FIG. 7.

FIG. 9 is a graph illustrating a color shift when a ratio S4/S3 is changed in the arrangement of fillers in FIG. 7.

In cases 2_1, 2_2, 2_3, 2_4 and 2_5 shown in FIG. 9, where a pattern ratio is about 45% and the ratio S4/S3 is 0.4, 0.5, 0.6, 0.7 and 0.9, respectively, as the ratio S4/S3 increases, a color shift in a horizontal direction increases and a color shift in a vertical direction decreases. Also, an azimuth angle at which a color shift is the smallest is repeatedly shown in cycles of 60° in an overall azimuth angle range in each of the cases 2_1, 2_2, 2_3, 2_4 and 2_5.

As shown in the graphs of FIGS. 8 and 9, a color shift at a specific azimuth angle may be adjusted by appropriately determining a pattern arrangement type. In one embodiment, for example, a color shift requirement in a horizontal direction may be generally less than a color shift requirement in a vertical direction in a display panel. Accordingly, in such an embodiment, the ratio S2/S1 may be set to be less than about 1, that is, the second distance S2 may be set to be less than the first distance 51, in the arrangement of FIG. 6, to allow a color shift in a horizontal direction to be less than a color shift in a vertical direction.

Figure 10:
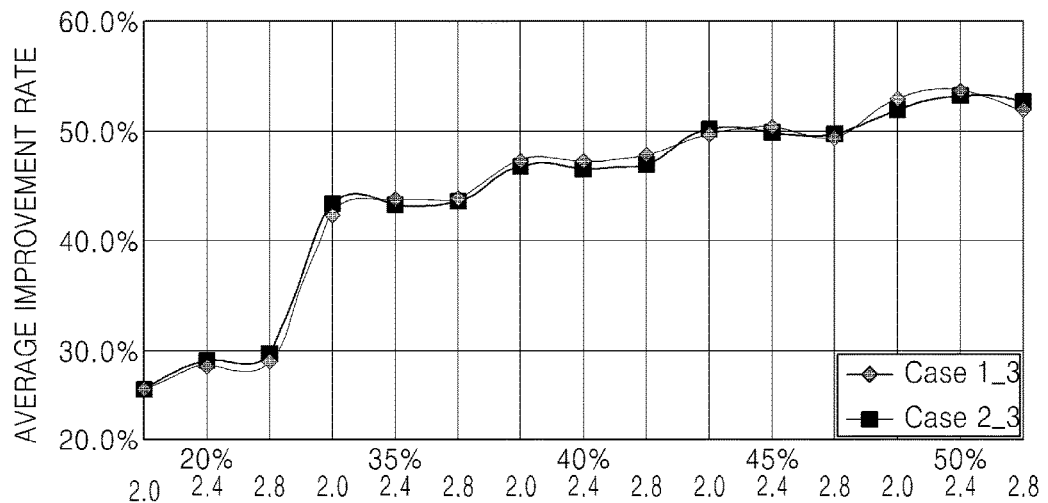
FIG. 10 is a graph illustrating an average improvement rate in an overall azimuth angle range when a pattern occupying ratio and an aspect ratio are changed in a case 2-3 and a case 1-3 of FIGS. 8 and 9.

FIG. 10 is a graph illustrating an average improvement rate in an overall azimuth angle range when a pattern occupying ratio and an aspect ratio are changed in the case 2_3 and the case 1_3 of FIGS. 8 and 9.

Referring to the graph of FIG. 10, in the case 2_3 and the case 1_3, an aspect ratio and an average improvement rate are in a range of about 2 to about 2.8, and an average improvement rate increases as a pattern occupying ratio increases.

Figure 11:
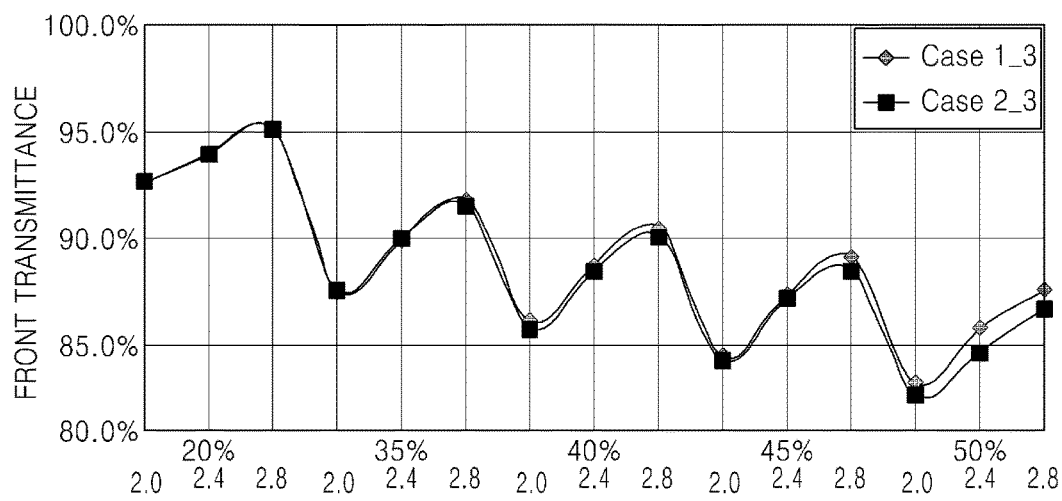
FIG. 11 is a graph illustrating a front transmittance when a pattern occupying ratio and an aspect ratio are changed in the case 2-3 and the case 1-3 of FIGS. 8 and 9.

FIG. 11 is a graph illustrating a front transmittance when a pattern occupying ratio and an aspect ratio are changed in the case 2_3 and the case 1_3 of FIGS. 8 and 9.

Referring to the graph of FIG. 11, as a pattern occupying ratio increases, a front transmittance generally decreases. When a pattern occupying ratio is predetermined, e.g., remains the same, a front transmittance increases as an aspect ratio increases.

In FIGS. 10 and 11, a pattern occupying ratio may be set to be equal to or greater than about 25% and equal to or less than about 50% based on a shape of an increase in an average improvement rate or a front transmittance of about 85%.

Figure 12:
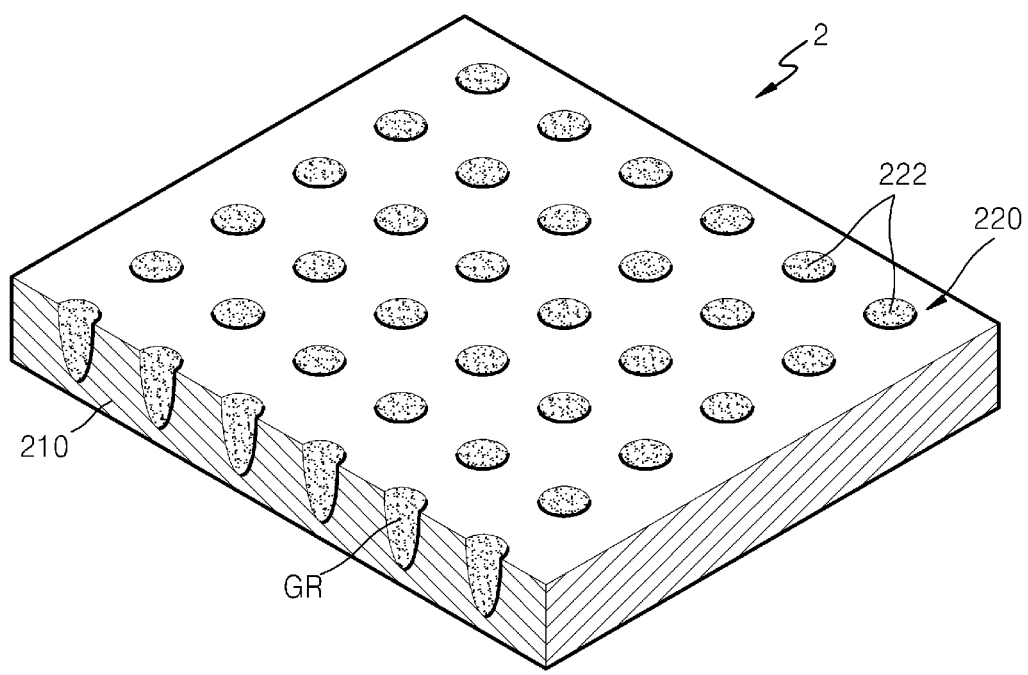
FIG. 12 is a perspective view illustrating an alternative embodiment of an optical film according to the invention.

FIG. 12 is a perspective view illustrating an alternative embodiment of an optical film 2 according to the invention.

In an embodiment, the optical film 2 includes a high refractive index pattern layer 210 having a pattern defined by the plurality of grooves GR, each having a curved groove surface, and a low refractive index pattern layer 220 including a plurality of fillers 222 corresponding to the plurality of grooves GR. In such an embodiment, the plurality of fillers 222 may fill the plurality of grooves GR, respectively. In such an embodiment, the low refractive index pattern layer 220 may not include a flat portion that connects the fillers 222, which is shown in FIG. 1. An arrangement and a shape of the fillers 222 are not limited to those shown in FIG. 12 and may be variously modified, e.g., to those shown in FIGS. 6 and 7.

An embodiment of the optical film 1 or 2 shown in FIGS. 1 and 12 may further include an adhesive layer, a circular polarization film, or a transmittance-adjusting layer that are typically included to be applied to an organic light-emitting display device, which will now be described in detail.

Figure 13:
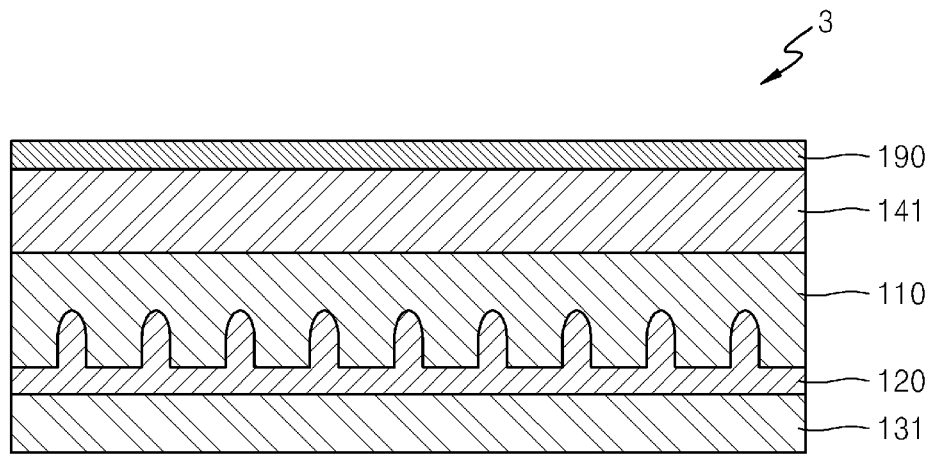
FIG. 13 is a cross-sectional view illustrating another alternative embodiment of an optical film according to the invention.

FIG. 13 is a cross-sectional view illustrating an alternative embodiment of an optical film 3 according to the invention.

In an embodiment, as shown in FIG. 13, the optical film 3 may further include an anti-reflection film 190 disposed on the high refractive index pattern layer 110, and a first adhesive layer 131 disposed under the low refractive index pattern layer 120. In such an embodiment, a first base film 141 may be further disposed between the high refractive index pattern layer 110 and the anti-reflection film 190.

The first adhesive layer 131 that is provided to be adhered to an organic light-emitting panel may include a pressure sensitive adhesive ("PSA") layer including a light absorber or a light diffuser. In an embodiment, the high refractive index pattern layer 110 and/or the low refractive index pattern layer 120 may include or be formed of a transparent material including a light absorber. When a material including a light absorber is applied to various layers constituting an optical film, a reflectance of external light may be reduced, thereby improving visibility.

The first base film 141, which may function as a substrate for forming the high refractive index pattern layer 110 during a manufacturing process, and the low refractive index pattern layer 120 may include or be formed of an optically isotropic material, for example, triacetyl cellulose ("TAC").

Figure 14:
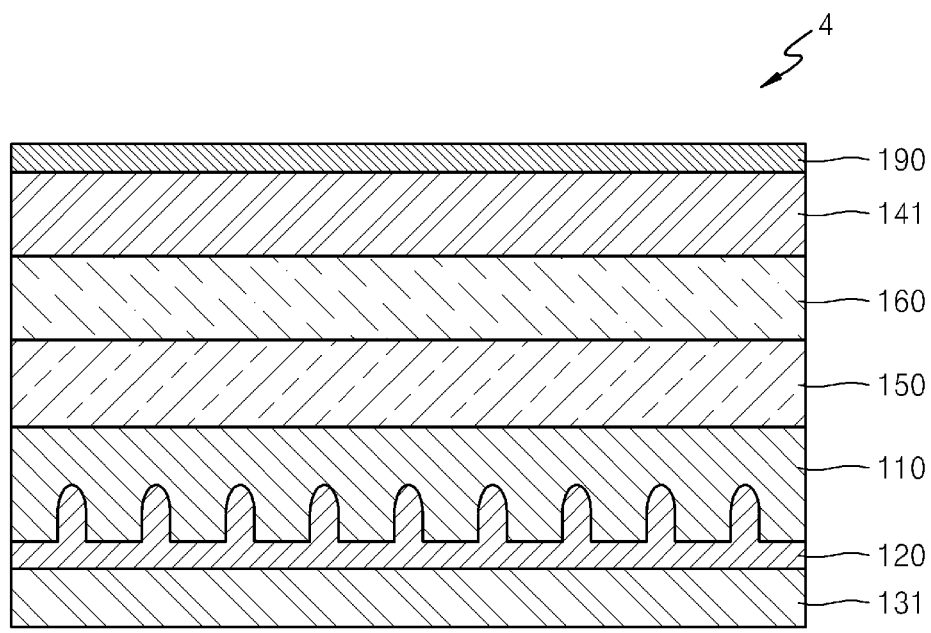
FIGS. 14 and 15 are cross-sectional views illustrating embodiments of an optical film including a circular polarization film, according to the invention.
Figure 15:
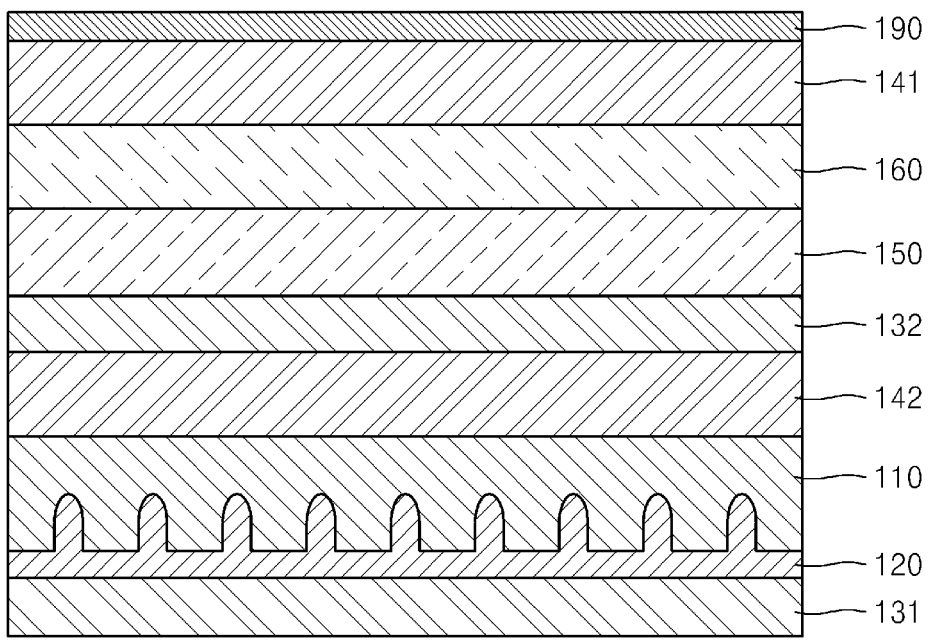

FIGS. 14 and 15 are cross-sectional views illustrating embodiments of an optical film 4 and 5 including a circular polarization film, according to the invention.

The circular polarization film may include a phase shift layer 150 and a linear polarization layer 160. The phase shift layer 150 may be, for example, a λ/4 phase difference film. The linear polarization film 160 may include a polyvinyl alcohol ("PVA") film or may have a TAO film-stacked structure or any of various other structures. The PVA film that polarizes light may be formed by adsorbing a dichroic pigment onto PVA that is a polymer.

Referring to FIGS. 14 and 15, an embodiment of the optical film 4 or 5 includes the adhesive layer 131, the low refractive index pattern layer 120, the high refractive index pattern layer 110, the phase shift layer 150, the linear polarization layer 160, the first base film 141 and the anti-reflection film 190, which are sequentially disposed one on another.

The circular polarization film, including the phase shift layer 150 and the linear polarization layer 160, functions to reduce a reflectance of external light and improve visibility. When external non-polarized light is incident, the external non-polarized light is changed to linearly polarized light by passing through the linear polarization layer 160, and the linearly polarized light is changed to circularly polarized light by passing through the phase shift layer 150. The circularly polarized light passes through an interfacial surface between the phase shift layer 150 and the high refractive index pattern layer 110, the high refractive index pattern layer 110, the low refractive index pattern layer 120 and the first adhesive layer 131, and is reflected by an interfacial surface between an organic light-emitting panel (not shown) and the first adhesive layer 131, and thereby the circularly polarization direction thereof is inversed or changed oppositely. Then, the circularly polarized light having inversed direction is changed to linearly polarized light that is perpendicular to a transmission axis of the linear polarization layer 160 by passing through the phase shift layer 150, such that the light is effectively prevented from being emitted to the outside.

As shown in FIG. 14, in such an embodiment, where the circular polarization film is disposed on the high refractive index pattern layer 110, if the high refractive index pattern layer 110 includes or is formed of an anisotropic material whose optical axis is different from the circular polarization film, polarization may not be maintained, incident external light may be emitted to the outside again, a reflectance may be drastically increased, and thus visibility may be reduced. Accordingly, in an embodiment, the high refractive index pattern layer 110 may include or be formed of an isotropic material whose optical axis is the same as that of the circular polarization film, such as TAO or solvent-cast polycarbonate ("PC"), for example.

In an embodiment of the optical film 5, as shown in FIG. 15, a second base film 142 and a second adhesive layer 132 are further provided between the high refractive index pattern layer 110 and the phase shift layer 150 to be sequentially disposed from the high refractive index pattern layer 110 toward the phase shift layer 150.

Figure 16:
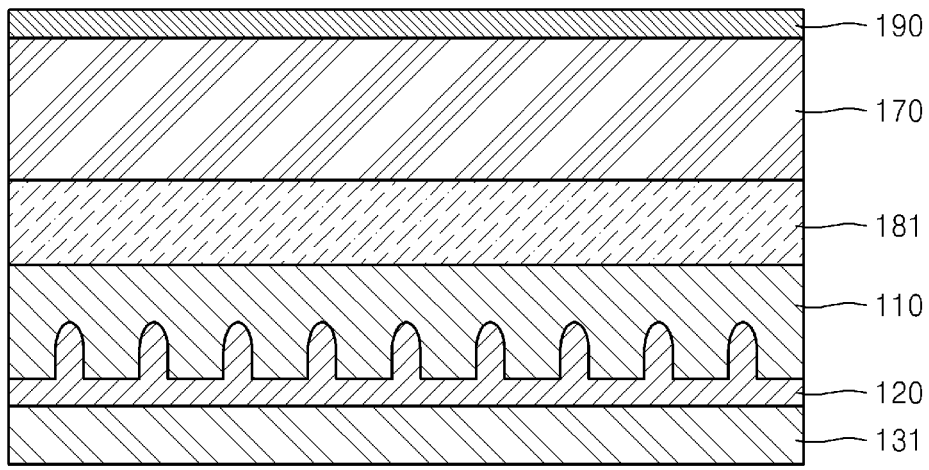
FIG. 16 is a cross-sectional view illustrating an embodiment of an optical film including a transmittance-adjusting layer, according to the invention.

FIG. 16 is a cross-sectional view illustrating an embodiment of an optical film 6 including a transmittance-adjusting layer 170, according the invention.

In such an embodiment, the transmittance-adjusting layer 170 may be a film that is formed by dispersing a black material for absorbing light such as a black dye, a pigment, carbon black or cross-linked particles, on which a black dye, a pigment or carbon black may be coated, in a polymer resin. In one embodiment, for example, the polymer resin may include, but are not limited to, a binder such as polymethyl methacrylate ("PMMA") and an ultraviolet ("UV")-curable resin such as an acryl-based resin. In an embodiment, a proportion of the black material contained in the polymer resin or a thickness of the transmittance-adjusting layer 170 may be determined or set based on optical properties of the black material. A transmittance of the transmittance-adjusting layer 170 may be equal to or greater than about 40%, which is slightly higher than a transmittance of the circular polarization film. Although the circular polarization film may completely block external light, a low transmittance is caused. The transmittance-adjusting layer 170 may be used to compensate for the disadvantage of low transmittance of the circular polarization film.

In an embodiment, the optical film 6 includes the first adhesive layer 131, the low refractive index pattern layer 120, the high refractive index pattern layer 110, a first carrier film 181, the transmittance-adjusting layer 170 and the anti-reflection film 190, which are sequentially disposed one on another.

The first carrier film 181 may function as a base substrate for forming the high refractive index pattern layer 110 and the low refractive index pattern layer 120, or as a base substrate for the anti-reflection film 190 or the transmittance-adjusting layer 170, during a manufacturing process of the optical film 6. In such an embodiment, where the optical film 6 of FIG. 16 does not include a linear polarization layer and does not need to maintain polarization, the optical film 6 may include or be formed of any of various materials including TAO, polyethylene terephthalate ("PET") and PC, for example.

Although the high refractive index pattern layer 110 and the low refractive index pattern layer 120 in embodiments of the optical film 3 through 6 shown in FIGS. 13 through 16 have a shape shown in FIG. 1, the shape is merely exemplary, and embodiments of the invention are not limited thereto. In such an embodiment, the shape of the high refractive index pattern layer 110 and the low refractive index pattern layer 120 may be modified to the shapes shown in FIGS. 6, 7 and 12 or a combination thereof. Also, an arrangement in embodiments of the optical film 3 through 6 shown in FIGS. 13 through 16 may be variously modified. In one embodiment, for example, positions of the phase shift layer 150 and the linear polarization layer 160 constituting the circular polarization film may be changed, or another layer may be disposed between the phase shift layer 150 and the linear polarization layer 160. In an embodiment, a second base film and a second carrier film may be added.

An embodiment of the above optical film described above refracts and emits light that is vertically incident and light that is obliquely incident in various directions including a front direction and a side direction. Also, an embodiment of the optical film described above may mix incident light at various angles in an overall azimuth angle range as well as in a horizontal direction by two-dimensionally arranging a dot pattern.

An embodiment of the optical film described above may be applied to an organic light-emitting display device. The organic light-emitting display device may include an organic light-emitting layer that has a microcavity structure configured to increase color purity. In such an organic light-emitting display device including an embodiment of the optical film, a color shift according to a viewing angle may be reduced at any azimuth angle, thereby displaying a high-quality image.

Figure 17:
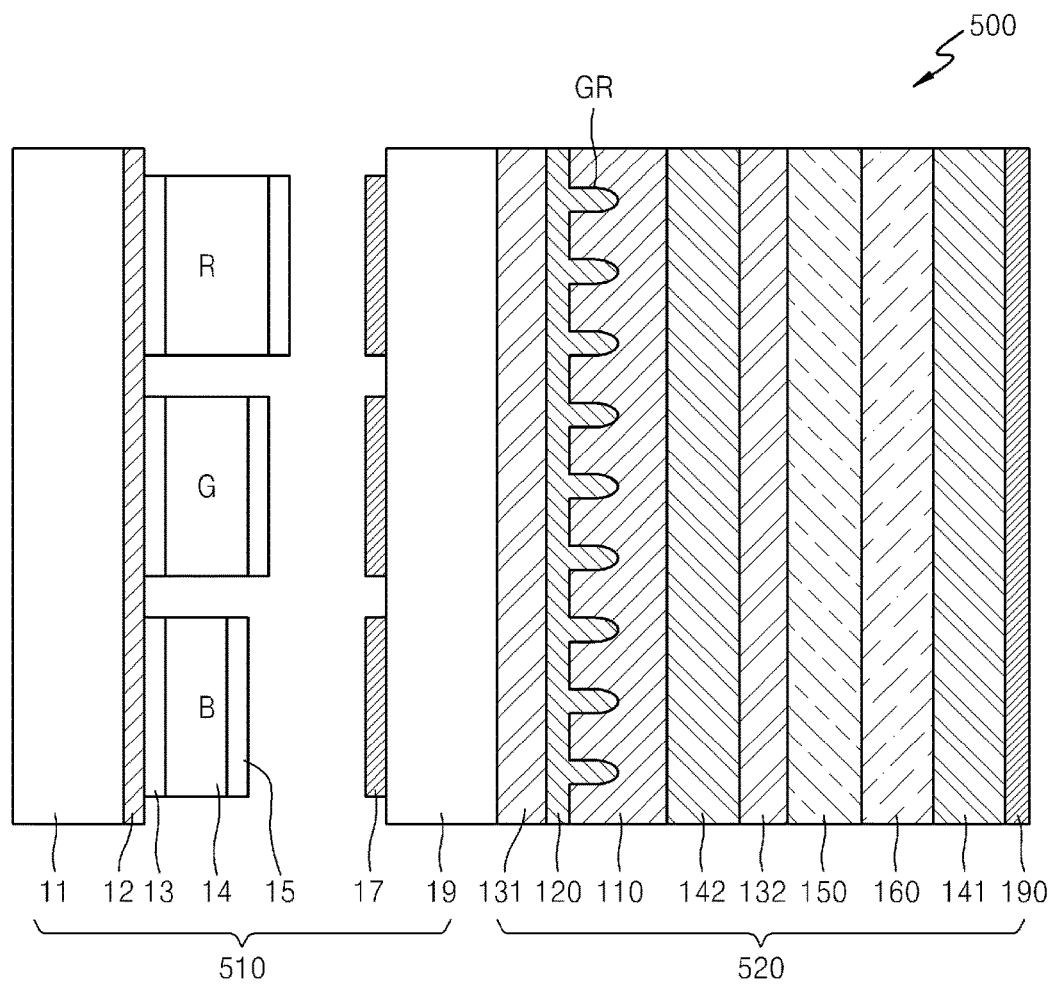
FIG. 17 is a cross-sectional view illustrating an embodiment of an organic light-emitting display device according to the invention.

FIG. 17 is a cross-sectional view illustrating an embodiment of an organic light-emitting display device 500 according to the invention.

An embodiment of the organic light-emitting display device 500 includes an organic light-emitting panel 510 that includes a plurality of pixels including organic light-emitting layers and each having a microcavity structure configured to resonate light of a corresponding wavelength to thereby emit light of different wavelengths, and an optical film 520 that is disposed on the organic light-emitting panel 510.

In an embodiment of the organic light-emitting display device 500, the optical film 520 may be substantially the same as one of the embodiments of the optical film 5 shown in FIGS. 15 to 17, but not being limited thereto. In an alternative embodiment, the optical film 520 of the organic light-emitting display device 500 may have a structure of an embodiment of the optical film 1, 1', 2, 3, 4 or 6 described above.

The organic light-emitting panel 510 may have a microcavity structure to increase a luminance and a color purity. In an embodiment, the organic light-emitting panel 500 includes a plurality of OLEDs that emit any of red (R), green (G), blue (B) and white light, and each OLED includes an anode 13, an organic light-emitting layer 14 and a cathode 15. As shown in FIG. 17, in an embodiment where the organic light-emitting panel 510 includes OLEDs whose unit pixels are configured to emit red, green and blue light, a microcavity structure may have a structure in which a distance between the anode 14 and the cathode 16 of the OLED that emits light of a longest wavelength (e.g., red light) is the longest, and a distance between the anode 14 and the cathode 16 of the OLED that emits light of a shortest wavelength (e.g., blue light) is the shortest. In such an embodiment, a distance between the anode 13 and the cathode 15 in the organic light-emitting panel 510 is set to correspond to a representative wavelength of each of red, green and blue light, to resonate and emit only light of corresponding wavelength to the outside and weaken light of other wavelengths.

A structure of an embodiment of the organic light-emitting panel 510 will now be described in detail.

In an embodiment, each sub-pixel of the organic light-emitting panel 510 may include an OLED that is disposed between a first substrate 11 and a second substrate 19 that face each other and includes the anode 13, the organic light-emitting layer 14 and the cathode 15, and a driving circuit unit 12 that is disposed on the first substrate 11 and is electrically connected to the anode 13 and the cathode 15.

In an embodiment, the anode 13 may include or be formed of an opaque metal such as aluminum (Al), and the cathode 15 may be a transparent electrode including or formed of, for example, indium tin oxide ("ITO"), or a semi-transparent electrode including or formed of, for example, nickel (Ni), such that light emitted from the organic light-emitting layer 14 may be effectively transmitted through the cathode 15.

The driving circuit unit 12 may include at least two thin-film transistors ("TFT"s) (not shown) and capacitors (not shown), and controls a brightness of the OLED by controlling the amount of current supplied to the OLED based on a data signal.

In an embodiment, the driving circuit unit 12, which is a circuit for driving a unit pixel of the organic light-emitting panel 510, may include a gate line, a data line that may perpendicularly cross the gate line, a switching TFT that is connected to the gate line and the data line, a driving TFT that is connected to the OLED between the switching OLED and a power line, and a storage capacitor that is connected between a gate electrode of the driving TFT and the power line.

In such an embodiment, the switching TFT applies a data signal of the data line to a gate electrode of the driving TFT and the storage capacitor in response to a scan signal of the gate line. The driving TFT controls a brightness of the OLED by adjusting current supplied to the OLED from the power line in response to a data signal from the switching TFT. In such an embodiment, the storage capacitor stores a data signal from the switching TFT and applies a stored voltage to the driving TFT, and thus the driving TFT enables substantially constant current to be supplied even when the switching TFT is turned off.

The organic light-emitting layer 14 includes a hole injection layer ("HIL"), a hole transport layer ("HTL"), a light-emitting layer, an electron transport layer ("ETL"), and an electron injection layer ("EIL") that are sequentially stacked on the anode 13. In an embodiment, when a forward voltage is applied between the anode 13 and the cathode 15, electrons move from the cathode 15 through the EIL and the ETL into the light-emitting layer, and holes move from the anode 13 through the HIL and the HTL into the light-emitting layer. The electrons and the holes injected into the light-emitting layer recombine in the light-emitting layer, to generate excitons, and light is emitted when the state of the excitons change from an excited state to a ground state. In such an embodiment, a brightness of the emitted light is substantially proportional to the amount of current that flows between the anode 13 and the cathode 15.

In an embodiment, the organic light-emitting panel 510 includes a color filter 17 to improve color efficiency. In such an embodiment, the color filter 17 may be disposed on the second substrate 19. In one embodiment, for example, a red color filter is disposed in a red sub-pixel region, a green color filter is disposed in a green sub-pixel region, and a blue color filter is disposed in a blue sub-pixel region. In an embodiment, where the unit pixel includes 4 colors (e.g., red, green, blue and white), the color filter 17 may be omitted in a white sub-pixel region.

In an embodiment, although not shown in FIG. 17, a black matrix for effectively preventing light leakage and color mixture may be further disposed at a boundary of each sub-pixel of the second substrate 19.

In an embodiment of the organic light-emitting display device 500 having a microcavity structure, a color shift occurs toward a short wavelength because as a viewing angle tilts from a front to a lateral side, maximum resonant wavelength moves to short wavelength. In such an embodiment, although white light is observed at the front, a blue shift may occur at the lateral side, and thus light may become bluish.

In an embodiment, the organic light-emitting display device 500 includes the optical film 520 that is disposed on the organic light-emitting display panel 510 to reduce such a color shift.

In such an embodiment, the grooves GR of the optical film 520 may be two-dimensionally arranged in a first direction and a second direction as described with reference to FIG. 1, and the optical film 520 may be disposed on the organic light-emitting panel 510 such that the first direction and the second direction may correspond to a horizontal direction Y and a vertical direction Z of the organic light-emitting panel 510.

In such an embodiment, as described with reference to FIGS. 2 and 3, the high refractive index pattern layer 110 and the low refractive index pattern layer 120 of the optical film 520 function as a color shift-reducing layer by allowing light that is incident at a constant angle to be emitted at various angles. The light emitted from the organic light-emitting display panel 510 may have a predetermined angle distribution at which light is emitted and has a color shift that varies according to the angle. After passing through the color shift-reducing layer including the high refractive index pattern layer 110 and the low refractive index pattern layer 120, light that is incident on the color shift-reducing layer at an angle that causes a large color shift and light that is incident on the color shift-reducing layer at an angle that causes a small color shift are substantially uniformly mixed and emitted, thereby reducing a color shift according to a viewer's viewing angle. In such an embodiment, where the optical film 520 includes a pattern that is two-dimensionally arranged, a color shift according to a viewing angle may be reduced in an overall any azimuth angle range as well as in a horizontal direction.

In such an embodiment, where the optical film 520 is disposed to reduce a color shift according to a viewing angle, image distortion may occur due to the optical film 520. Accordingly, in such an embodiment, a distance between the organic light-emitting layer 14 and the optical film 520 may be equal to or less than about 1.5 millimeters (mm) to minimize such image distortion.

While one or more embodiments of the invention have been described with reference to the figures, it will be understood by those of ordinary skill in the art that various changes in form and details may be made therein without departing from the spirit and scope of the invention as defined by the following claims. Accordingly, the true technical scope of the invention is defined by the technical spirit of the appended claims.

What is claimed is:

1. An optical film comprising:
    a high refractive index pattern layer comprising a material having a refractive index greater than about 1,
    wherein a plurality of grooves is defined on a first surface of the high refractive index pattern layer, the plurality of grooves defines a pattern of the high refractive index pattern layer, the plurality of grooves is repeatedly arranged along a first direction and is repeatedly arranged along a second direction; and
    a low refractive index pattern layer comprising a plurality of fillers corresponding to the plurality of grooves and a flat portion which connects the plurality of fillers, the plurality of fillers and the flat portion comprising a material having a refractive index less than the refractive index of the high refractive index pattern layer,
    wherein light incident through the low refractive index pattern layer is emitted through the high refractive index pattern layer,
    wherein a distance between two adjacent grooves in the first direction is defined as a first distance, and a distance between two adjacent grooves is defined as a second distance, and
    wherein an average of first distances among all adjacent grooves in the first direction and an average of second distances among all adjacent grooves in the second direction are different from each other.

2. The optical film of claim 1, wherein a cross-sectional shape of each of the plurality of grooves in the first surface is an isotropic shape.

3. The optical film of claim 1, wherein the plurality of grooves is arranged in a quadrangular form.

4. The optical film of claim 3, wherein the plurality of grooves are arranged in a rectangular form.

5. The optical film of claim 1, wherein
    the plurality of grooves is arranged along a plurality of straight lines, the plurality of straight lines extending in the first direction and being spaced apart from one another in the second direction, and
    the grooves on adjacent straight lines of the plurality of straight lines are alternately disposed in a zigzag manner.

6. The optical film of claim 1, wherein an area ratio of an area of the pattern to an area of a boundary surface between the high refractive index pattern layer and the low refractive index pattern layer is equal to or greater than about 25% and equal to or less than about 50%.

7. The optical film of claim 1, wherein a ratio of the depth to the width of each of the plurality of grooves is in a range from about 2 to about 2.8.

8. The optical film of claim 1, further comprising:
    an anti-reflection film disposed on a second surface of the high refractive index pattern layer, which is opposite to the first surface; and
    an adhesive layer disposed on the low refractive index pattern layer.

9. The optical film of claim 8, further comprising:
    a circular polarization film disposed between the high refractive index pattern layer and the anti-reflection film, and comprising a phase shift layer and a linear polarization layer.

10. The optical film of claim 8, further comprising:
    a transmittance-adjusting layer disposed between the high refractive index pattern layer and the anti-reflection film.

11. An organic light-emitting display device comprising:
    an organic light-emitting panel comprising a plurality of pixels comprising organic light-emitting layers, wherein the organic light-emitting layers emit light of different wavelengths from each other, and each of the plurality of pixels has a microcavity structure which resonates light corresponding to one of the different wavelengths; and
    the optical film of claim 1 disposed on the organic light-emitting panel.

12. The organic light-emitting display device of claim 11, wherein the first direction and the second direction, in which the plurality of grooves is two-dimensionally arranged, respectively correspond to a horizontal direction and a vertical direction of the organic light-emitting panel.

13. The organic light-emitting display device of claim 12, wherein the second distance is less than the first distance.

14. The organic light-emitting display device of claim 11, further comprising:
    a first adhesive layer disposed between the organic light-emitting panel and the low refractive index pattern layer; and
    an anti-reflection film disposed on the high refractive index pattern layer.

15. The organic light-emitting display device of claim 14, further comprising:
    a circular polarization film disposed between the high refractive index pattern layer and the anti-reflection film, and comprising a phase shift layer and a linear polarization layer.

16. The organic light-emitting display device of claim 14, further comprising:
    a transmittance-adjusting layer disposed between the high refractive index pattern layer and the anti-reflection film.

* * * * *